(12) United States Patent
Lim

(10) Patent No.: US 7,005,627 B2
(45) Date of Patent: Feb. 28, 2006

(54) IMAGE SENSOR

(75) Inventor: Keun Hyuk Lim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 70 days.

(21) Appl. No.: 10/746,498

(22) Filed: Dec. 29, 2003

(65) Prior Publication Data

US 2004/0135066 A1    Jul. 15, 2004

(30) Foreign Application Priority Data

Dec. 30, 2002    (KR) .................. 10-2002-0087309

(51) Int. Cl.
*H01L 27/00* (2006.01)
(52) U.S. Cl. .................. 250/208.1; 250/216; 359/619
(58) Field of Classification Search ............ 250/208.1, 250/214.1, 216; 257/222, 225, 234, 258, 257/291, 294, 432; 359/619–622
See application file for complete search history.

(56) References Cited

U.S. PATENT DOCUMENTS

| | | | |
|---|---|---|---|
| 4,222,633 A | 9/1980 | Hock | |
| 4,901,153 A | 2/1990 | Machida et al. | |
| 5,670,384 A | 9/1997 | Needham | |
| 6,624,404 B1 | 9/2003 | Lee et al. | |
| 6,831,311 B1 * | 12/2004 | Uchida | ................ 257/290 |

\* cited by examiner

*Primary Examiner*—David Porta
*Assistant Examiner*—Patrick J. Lee
(74) *Attorney, Agent, or Firm*—Finnegan, Henderson, Farabow, Garrett & Dunner, L.L.P.

(57) ABSTRACT

An image sensor includes a light-incidence regulating layer for compensating for a refractive index deflection between a micro lens array and the atmosphere between the micro lens array and an external lens is disposed at an upper portion of the micro lens array, so that light incident on the micro lens array has a vertical direction irrespective of which portion of the external lens the light is transmitted through. Therefore, the light is incident upon all photo diodes in a semiconductor substrate in a vertical direction, and an amount of light received by the photo diodes is uniform irrespective of the positions of the photo diodes. Photocharges generated and accumulated by the photo diodes are also uniform, and the presentation quality of the image is greatly improved.

8 Claims, 4 Drawing Sheets

IMAGE SENSOR

This application is based on and claims the priority of Korean Patent Application No. 10-2002-0087309, filed on Dec. 30, 2002, the entire contents of which are incorporated herein by reference.

BACKGROUND OF THE INVENTION

1. Field of the Invention

The present invention relates to an image sensor, and more particularly to an image sensor which may render light entering a micro lens to have a vertical direction irrespective of the position of which portion of an external lens the light is transmitted through, by additionally disposing, at an upper portion of a micro lens array, a light-incidence regulating layer for compensating a refractive index deflection between the micro lens array and the atmosphere between the micro lens array and an external lens.

2. Description of the Prior Art

Recently, with a rapid development of the electric/electronic technologies, various electronics, such as video cameras, digital still cameras, minicam adapted personal computers (PC), minicam adapted mobile phones and so forth, employing image sensor technologies have been widely developed and used.

Traditionally, in a conventional image sensor as described above, a charge coupled device (CCD) has been generally used. However, such CCD has drawbacks in high driving voltage, a separate additional support circuit, and high per-unit prices, so that the usage thereof has been on the decrease presently.

Recently, as an image sensor for overcoming the disadvantages of the CCD, attention is attracted to a Complementary Metal Oxide Semiconductor (CMOS) image sensor. Since the CMOS image sensor is manufactured based on CMOS circuit technologies, it, contrary to the existing CCD, has advantages in that it can be driven with low voltage, it does not require an additional support circuit, it has a low per-unit price and so on.

As shown in FIG. 1, such conventional image sensor, for example, CMOS image sensor, includes a micro lens array 7 for focusing light entering from an external lens 100, a color filter array 6 for coloring light focused by the micro lens array 7, and a light-transmission layer 4 for transmitting light colored by the color filter array 6 to a photo diode array 3, which is formed in an active region of a semiconductor substrate 1 and defined by an element isolating layer 2, for generating and accumulating photocharges through receiving light transmitted through the light-transmission layer 4. On the light-transmission layer 4, a flattened layer 5 inducing a constant light transmission by planarizing a lower part of the color filter array 6 is additionally disposed.

In such image sensor system according to the prior art, as described above, light transmitted through the external lens 100 is transmitted to the photo diode array 3 through the micro lens array 7, the color filter array 6, the light-transmission layer 4, etc. Herein, light transmitted through the external lens 100 shows different incidence features to the micro lens array 7, due to a characteristic property of the external lens 100, and depending on which portion of external lens 100 the light is transmitted through.

For example, as shown in FIG. 2, light transmitted through a center portion of the external lens 100 shows an incidence feature that it is directed vertically at the corresponding micro lens 7b (i.e., the micro lens at a center portion of the semiconductor substrate), whereas light transmitted through a circumference of the external lens 100 slants to the corresponding micro lens 7a, 7c (i.e., the micro lens positioned near the circumference of the semiconductor substrate).

Herein, since the refractive index difference between the respective micro lenses 7a and 7c and the atmosphere facing the respective micro lenses is large, if light L1 or L3 incident upon the respective micro lenses 7a or 7c directly slants to the micro lenses without a separate intermediate medium, the respective micro lenses may refract corresponding light L1 or L3 at a large refraction angle and transmit the refracted light to the respective photo diodes 3a or 3c (i.e., the photo diode positioned near the circumference of the semiconductor substrate) corresponding to the respective micro lenses.

In contrast, the micro lens 7b positioned at a center portion of the semiconductor substrate 1 receives light transmitted through the external lens 100 in a direction substantially vertical to the micro lens 7b, so that the micro lens 7b can transmit corresponding light to the photo diode 3b (i.e., the photo diode positioned at the center portion of the semiconductor) without refraction.

As described above, when light slanting to the photo diode 3a or 3c positioned near the circumference of the semiconductor substrate 1 is refracted, corresponding light is unnecessarily dispersed, so that the photo diodes 3a and 3c near the circumference of the semiconductor substrate 1 receive a lesser amount of light, compared with the photo diode 3b at the center portion of the semiconductor substrate 1. That is, in the conventional system, the amount of light received by the photo diode 3a or 3c near the circumference of the semiconductor substrate is greatly different from that received by the photo diode 3b at the center portion of the semiconductor substrate unless a separate measure is adopted In such a case that light receiving quantity is different according to the positions of the photo diodes 3a, 3b and 3c, if a separate measure is not adopted, a quantity of photocharges generated and accumulated by the respective photo diodes 3a, 3b and 3c is inconstant, with the result that presentation quality of the image is greatly degraded.

In the prior art, considering these problems, as shown in the drawing, there has been suggested a method which increases probability for light-receiving at the corresponding photo diodes 3a and 3c and thus compensates for an unbalance of light-receiving quantity in the respective photo diodes 3a, 3b and 3c, by increasing the sizes W1 and W3 of the photo diodes 3a and 3c near the circumference of the semiconductor substrate 1 relative to a size W2 of the photo diode 3b at the center portion of the semiconductor substrate 1.

However, since the difference of a concentration factor between the respective photo diodes 3a, 3b and 3c basically exists although the sizes of the photo diodes 3a and 3c are increased relative to that of the photo diode 3b, it is difficult to resolve a problem of unbalance of light-receiving in the photo diodes 3a, 3b and 3c only by regulating the sizes of the photo diodes. Further, in order to regulate the sizes of the respective photo diodes 3a, 3b and 3c differently, a complicated cell design must be performed and the overall production efficiency is greatly reduced.

SUMMARY OF THE INVENTION

Accordingly, the present invention has been provided to solve the above-mentioned problems in the prior art, and a feature of the present invention is to provide an image sensor in which a light-incidence regulating layer for compensating a refractive index deflection between a micro lens array and the atmosphere between the micro lens array and an external lens is disposed at an upper portion of the micro lens array so that light incident on the micro lens array is in a vertical direction irrespective of which portion of the external lens the light is transmitted through. Thus, the respective lenses of the micro lens array transmit the light substantially vertically upon all corresponding photo diodes in a semiconductor substrate without additional refraction. As a result, the photo diodes receive a substantially uniform amount of light irrespective of their positions.

Another feature of the present invention is to provide an image sensor in which light-incidence regulating layer is additionally disposed so that the respective photo diodes receive a substantially uniform amount of light irrespective of their positions and the photocharges generated and accumulated by the respective photo diodes are also uniform, thereby greatly improving a production quality of the finished image.

A further feature of the present invention is to provide an image sensor in which light-incidence regulating layer is additionally disposed to make uniform an amount of light received by the photo diodes so that design change for size of the photo diode in the manufacturing procedure is unnecessary, thereby preventing a degradation of the production efficiency due to the design change.

In order to attain at least the above features, there is provided an image sensor including: a micro lens array for focusing incident light; a photo diode array disposed in an active region of a semiconductor substrate for generating and accumulating photocharges through receiving the incident light focused by the micro lens array; a light-transmission layer deposited on an upper part of the semiconductor substrate to cover the photo diode array for transmitting the incident light focused by the micro lens array to the photo diode array; and a light-incidence regulating layer disposed on the micro lens array for selectively refracting the incident light to be focused by the micro lens array in order for the light focused by the micro lens array to be transmitted to the photo diode array in a direction vertical to the photo diode array.

BRIEF DESCRIPTION OF THE DRAWINGS

The above and other features and advantages of the present invention will be more apparent from the following detailed description taken in conjunction with the accompanying drawings, in which.

DETAILED DESCRIPTION OF THE EMBODIMENTS

Figure 1:
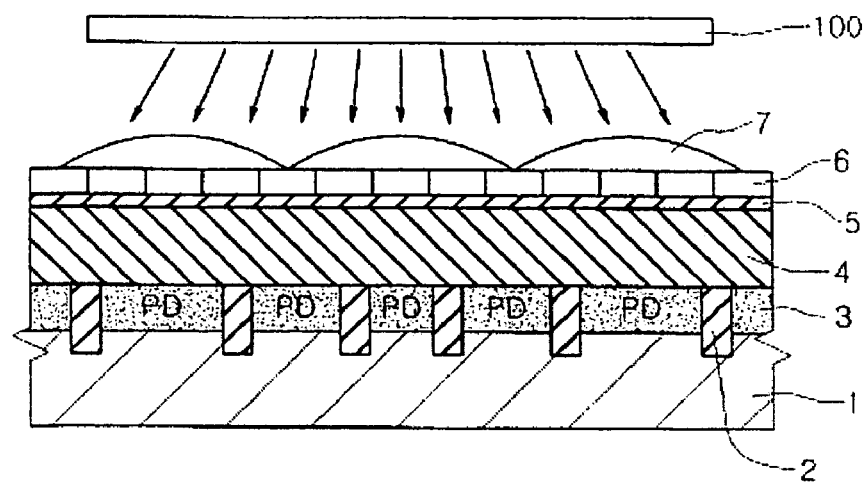
FIG. 1 shows an exemplary cross-sectional view of an image sensor according to the prior art.
Figure 2:
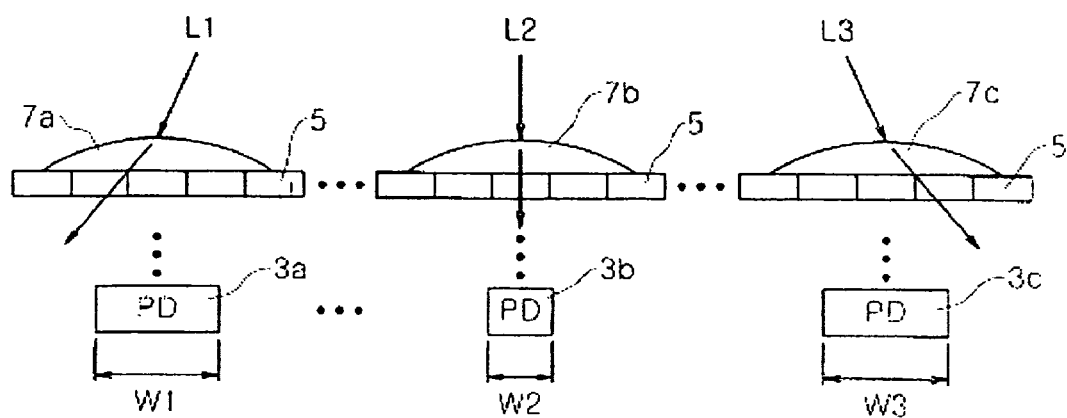
FIG. 2 illustrates a procedure of incidence/exit of light through a micro lens array according to the prior art.

Hereinafter, an embodiment of the present invention will be described with reference to the accompanying drawings. In the following description and drawings, the same reference numerals are used to designate the same or similar components, and so repetition of the description of the same or similar components will be omitted.

Figure 3:
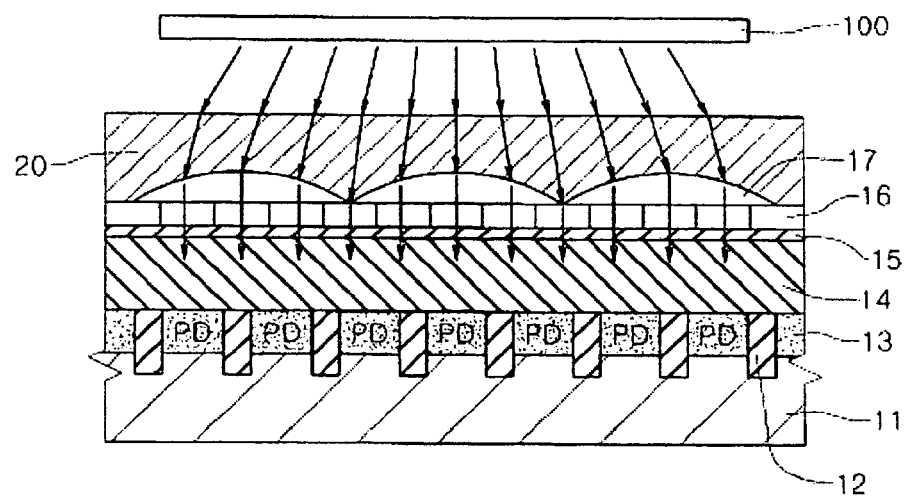
FIG. 3 shows an exemplary cross-sectional view of an image sensor according to an embodiment of the present invention.

As shown in FIG. 3, an image sensor according to the present invention includes a micro lens array 17 for focusing light incident from an external lens 100, a color filter array 16 for coloring the light focused by the micro lens array 17, a light-transmission layer 14 for transmitting the light colored by the color filter array 16 to a photo diode array 13, wherein the photo diode array 13 is formed in an active region of a semiconductor substrate 11 and defined by an element isolating layer 12, and is for generating and accumulating photocharges through receiving the light transmitted through the light-transmission layer 14.

Herein, the light-transmission layer 14 including, for example, an insulating layer, a metal interconnect, an interlayer dielectric and so on, has a structure supporting the micro lens array 17, and is disposed on an upper part of the semiconductor substrate 11 to cover the photo diode array 13. On the light-transmission layer 14, a flattened layer 15 for inducing a constant light transmission by planarizing a lower part of the color filter array 16 is additionally disposed.

In this case, flattened layer 15 is additionally disposed under a flattened bottom of the color filter array 16 and on the light-transmission layer 14 so as to induce a constant light transmission.

Figure 4:
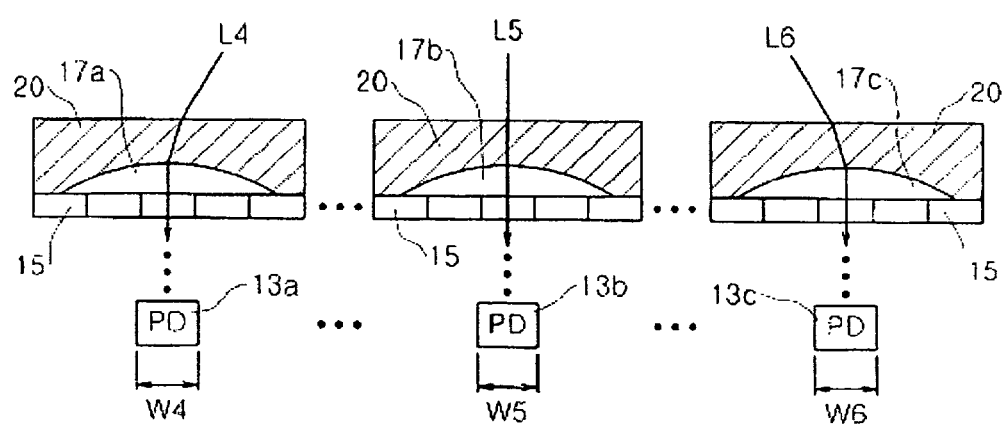
FIG. 4 illustrates a procedure of incidence/exit of light through a micro lens array according to an embodiment of the present invention.

In such system of the present invention, as shown in FIG. 4, light L5 transmitted through a center portion of the external lens 100 enters the corresponding micro lens 17b (i.e., the micro lens at a center portion of the semiconductor substrate) in a direction vertical to micro lens 17b, whereas light L4 and L6 transmitted through a circumference of the external lens 100 slants to the corresponding micro lens 17a and 17c (i.e., the micro lens positioned near the circumference of the semiconductor substrate).

In this case, if a separate measure is not adopted, the light transmitted through the external lens 100 is refracted at a great angle by the micro lenses 17a and 17c positioned near the circumference of the semiconductor substrate 11 and is transmitted to the respective photo diodes 13a and 13c (i.e., the photo diode near the circumference of the semiconductor substrate). As a result, the respective photo diodes 13a and 13c near the circumference of the semiconductor substrate 11 receive a lesser amount of light, compared with the photo diode 13b at the center portion of the semiconductor substrate 11.

However, according to the present invention, a light-incidence regulating layer 20, for compensating for refractive index deflection between the micro lens array 17 and the air between the micro lens array 17 and the external lens 100, is additionally disposed.

In this case, preferably, the light-incidence regulating layer 20 may include a light-transmission oxide layer such as Undoped Silicate Glass (USG) layer, Boron-Phosphorus Silicate Glass (BPSG) layer, Tetra Ethyl Ortho Silicate (TEOS) layer, High Density Plasma (HDP) oxide layer, TEOS/SiH$_4$ layer or the like.

Herein, the light-incidence regulating layer 20 has a refractive index, preferably, 1.1~1.5, relatively smaller than that of the micro lens array 17.

The micro lens array 17 has a refractive index of 1.58~1.6. In contrast, the light-incidence regulating layer 20 has a smaller refractive index than that of the micro lens array 17. For example, the USG layer has a refractive index of 1.481~1.483, the BPSG layer has a refractive index of 1.486~1.488, the TEOS layer has a refractive index of 1.462~1.464, the HDP oxide layer has a refractive index of 1.481~1.483, and the TEOS/SiH$_4$ layer has a refractive index of 1.462~1.464.

By forming the light-incidence regulating layer 20 having a relatively smaller refractive index on the micro lens array 17, for example, as shown in the drawing, light transmitted through the external lens 100 at a slanted angle can be refracted substantially and directed vertically to the micro lens array 17, depending upon a refracting operation of the light-incidence regulating layer 20 according to Snell's law. As a result, the micro lenses 17a and 17c (i.e., the micro lens near the circumference of the semiconductor substrate) can transmit the corresponding light in a direction vertical to corresponding photo diodes, as does the micro lens 17b (i.e., the micro lens positioned at the center portion of the semiconductor substrate).

Therefore, when the micro lenses 17a, 17b and 17c disposed at the respective positions can transmit light in a direction vertical to corresponding photo diodes due to a compensating refracting operation of the light-incidence regulating layer 20, the respective photo diodes 13a, 13b and 13c (i.e., the photo diodes positioned at the center portion and the circumference of the semiconductor substrate) disposed on the semiconductor substrate 11 can receive a substantially uniform amount of of light irrespective of their positions, and can generate and accumulate a uniform quantity of photocharges. Thus, the presentation quality of an image is greatly improved.

Also, according to the present invention as described above, since the respective photo diodes 13a, 13b and 13c receive a uniform amount of light irrespective of their positions, the respective photo diodes 13a, 13b and 13c can have a uniform size, irrespective of their positions.

When the respective photo diodes 13a, 13b and 13c have a uniform size irrespective of their positions, design change for the size of the photo diode is unnecessary in the manufacturing procedure. Therefore, degradation of the production efficiency due to the design change is prevented.

Meanwhile, according to the present invention, a thickness of the light-incidence regulating layer 20 may be a factor to take into consideration. If the thickness of the light-incidence regulating layer 20 is too thick, a transmission path of light is elongated beyond its need, causing a problem in that light transmitted through the micro lens array 17 does not reach the photo diode array 13 normally. On the other hand, if the thickness of the light-incidence regulating layer 20 is too thin, the micro lens array 17 cannot be normally covered and the light-incidence regulating layer 20 does not refract the light to a satisfactory extent.

Fully considering this fact, the present invention maintains the thickness of the light-incidence regulating layer 20 at 0.6~1.2 μm, thus to prevent the problems mentioned above.

Meanwhile, the present invention can be modified according to circumstances.

Figure 5:
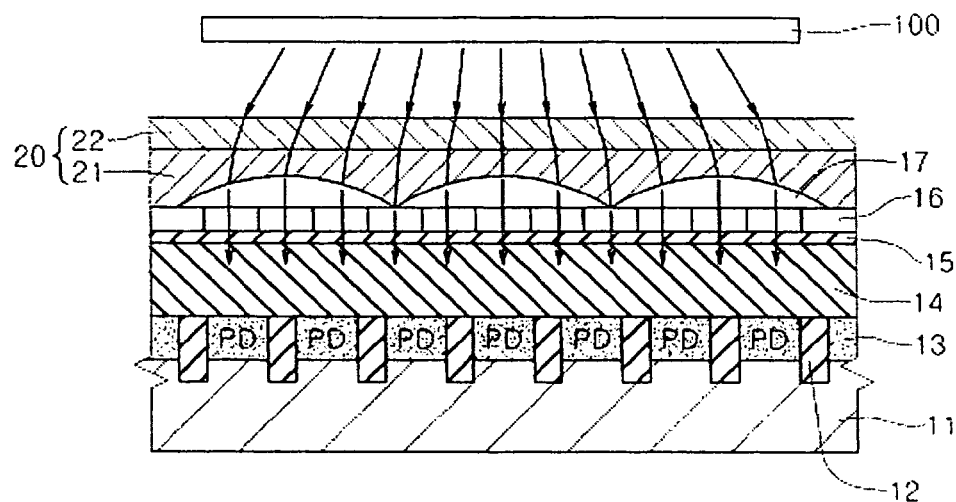
FIG. 5 shows an exemplary cross-sectional view of an image sensor according to another embodiment of the present invention.
Figure 6:
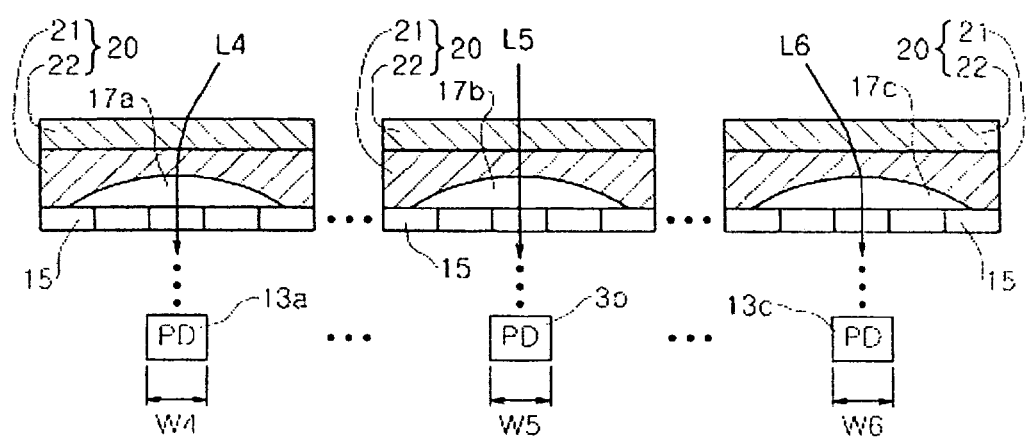
FIG. 6 illustrates a procedure of incidence/exit of light through a micro lens array according to another embodiment of the present invention.
Figure 7:
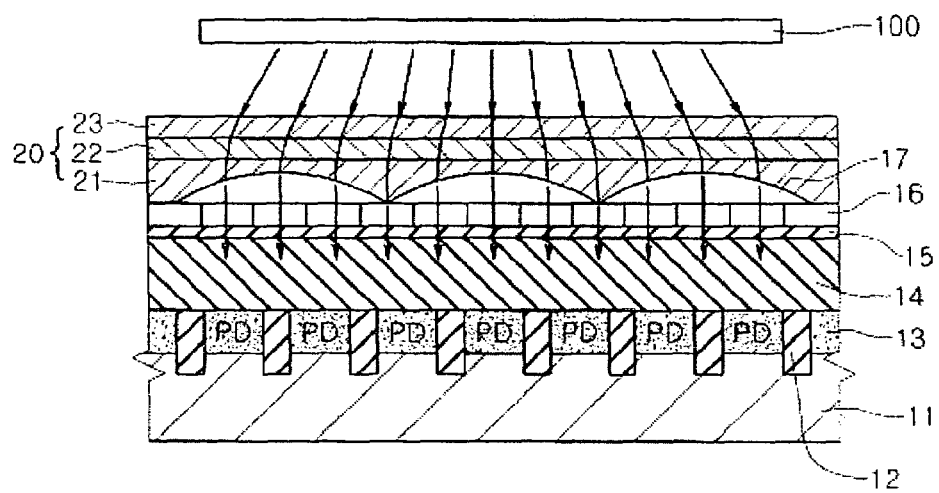
FIG. 7 shows an exemplary cross-sectional view of an image sensor according to the other embodiment of the present invention.

For example, as shown in FIGS. 5 and 6, the light-incidence regulating layer 20 can be formed of a multilayer having more than two layers whose refractive indexes are different from each other, and consisting of, for example, a first and a second light-incidence regulating layer 21 and 22 or a first, a second, and a third light-incidence regulating layer 21, 22 and 23.

Figure 8:
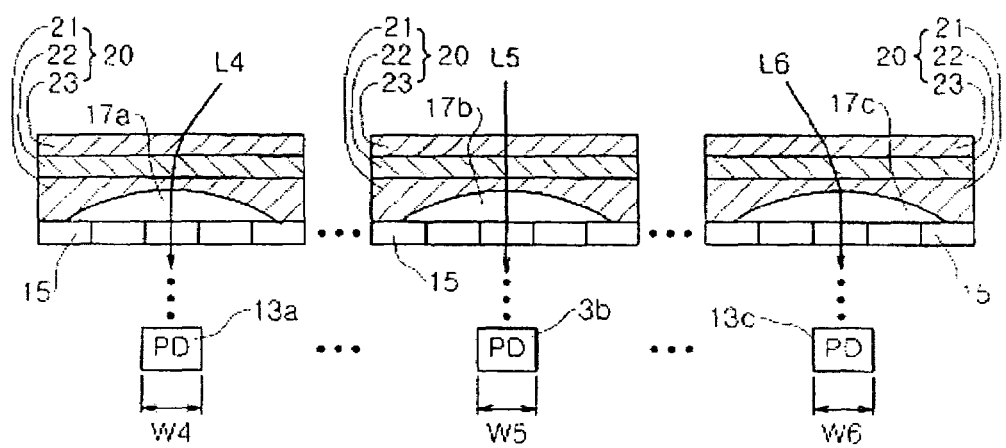
FIG. 8 illustrates a procedure of incidence/exit of light through a micro lens array according to the other embodiment of the present invention.

As shown in FIGS. 6 and 8, light L4 and L6 that slants to the light-incidence regulating layer 20 through the external lens 100 is refracted greatly and directed vertically to the micro lenses 17a and 17c, as is light L5, depending upon a successive refracting operation of the light-incidence regulating layer 20 according to Snell's law. Therefore, the micro lenses 17a and 17c (i.e., the micro lens near the circumference of the semiconductor substrate), contrary to the prior art, can transmit light in a direction vertical to corresponding photo diodes, as does the micro lens 17b (i.e., the micro lens positioned at the center portion of the semiconductor substrate).

When the micro lenses 17a, 17b and 17c transmit light in a direction vertical to corresponding photo diodes due to a compensating refracting operation of the light-incidence regulating layer 20, the respective photo diodes 13a, 13b and 13c (i.e., the photo diodes positioned at the center portion and the circumference of the semiconductor substrate) disposed on the semiconductor substrate 11 can receive a substantially uniform amount of light irrespective of their positions, and can generate and accumulate a uniform quantity of photocharges.

In a case where the light-incidence regulating layer 20 is formed of more than two layers whose refractive indexes are different from each other, which layer is set to have the higher refractive index may be a factor to take note of.

This is because, if the refractive indexes of the upper layer and the lower layer are not properly matched, light may slant to the micro lens array, due to an unnecessary interaction between the upper and lower layers.

Fully considering this fact, the present invention provides that the upper layer has a refractive index relatively smaller than that of the lower layer.

For example, when the light-incidence regulating layer 20 consists of the first and second layers 21 and 22, the second layer 22, i.e., the upper layer, has a refractive index relatively smaller than that of the first layer 21, i.e., the lower layer. When the light-incidence regulating layer 20 consists of the first, second and third layers 21, 22 and 23, the third layer 23, i.e., the upper layer has a relatively smaller refractive index than that of the second layer 22, i.e., the intermediate layer, and the second layer 22, i.e., the intermediate layer, has a relatively smaller refractive index than that of the first layer 21, i.e., the lower layer.

When the light-incidence regulating layer 20 consists of a multilayer having more than two layers whose refractive indexes are different from each other, if an upper layer has a relatively smaller refractive index than that of a lower layer, light transmitted through the external lens 100 and slanting to the upper layer can be greatly refracted depending upon a refracting operation of the upper layer according to Snell's law, with the result that the lower layer transmits the light to the micro lens array in a direction substantially vertical to the micro lens array As described above, according to the present invention, the light-incidence regulating layer for compensating a refractive index deflection between the micro lens array and the atmosphere between the micro lens array and the external lens is additionally disposed at the upper portion of the micro lens array, so that light entering the micro lens array has a vertical direction irrespective of which portion of the external lens the light is transmitted through. Thus, the micro lenses transmit light to all corresponding photo diodes disposed on the semiconductor substrate in a direction vertical to the photo diodes, so that the photo diodes can receive a uniform amount of light irrespective of their positions.

Since each photo diode can receive a uniform amount of light irrespective of its position through adding the light-incidence regulating layer, a quantity of photo charges that the photo diodes can generate and secure is also substantially uniform. Therefore, presentation quality of the image can be greatly improved.

Further, by making uniform an amount of light received by the respective photo diodes through the addition of the light-incidence regulating layer, design change for size of the photo diode in the manufacturing procedure is unnecessary. Therefore, a degradation of the production efficiency due to the design change is prevented.

Although several embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An image sensor, comprising:
    a micro lens array for refracting incident light;
    a photo diode array disposed in an active region of a semiconductor substrate for generating and accumulating photocharges through receiving the incident light from the micro lens array;
    a light-transmission layer deposited on an upper part of the semiconductor substrate to cover the photo diode array for transmitting the incident light from the micro lens array onto the photo diode array; and
    a light-incidence regulating layer disposed on the micro lens array for selectively refracting the incident light in order for the light from the micro lens array to be transmitted to the photo diode array in a direction vertical to the photo diode array.

2. The image sensor of claim 1, wherein the light-incidence regulating layer has a refractive index relatively smaller than a refractive index of the micro lens array.

3. The image sensor of claim 2, wherein the light-incidence regulating layer has a refractive index of 1.1~1.5.

4. The image sensor of claim 1, wherein the light-incidence regulating layer comprises a multilayer having more than two layers whose refractive indexes are different from each other.

5. The image sensor of claim 4, wherein an upper layer of the multilayer has a refractive index relatively smaller than a refractive index of a lower layer of the multilayer.

6. The image sensor of claim 1, wherein the light-incidence regulating layer comprises a light-transmission oxide layer.

7. The image sensor of claim 6, wherein the light-transmission oxide layer is any one of an Undoped Silicate Glass (USG) layer, a Boron-Phosphorus Silicate Glass (BPSG) layer, a Tetra Ethyl Ortho Silicate (TEOS) layer, a High Density Plasma (HDP) Oxide layer, and a TEOS/$SiH_4$ layer.

8. The image sensor of claim 1, wherein the thickness of the light-incidence regulating layer is 0.6~1.2 $\mu$m.

* * * * *